US006832177B2

(12) United States Patent
Khandekar et al.

(10) Patent No.: US 6,832,177 B2
(45) Date of Patent: Dec. 14, 2004

(54) METHOD OF ADDRESSING INDIVIDUAL MEMORY DEVICES ON A MEMORY MODULE

(75) Inventors: Narendra S. Khandekar, Folsom, CA (US); Howard S. David, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 55 days.

(21) Appl. No.: 10/330,712

(22) Filed: Dec. 27, 2002

(65) Prior Publication Data

US 2004/0128429 A1 Jul. 1, 2004

(51) Int. Cl.[7] .................. G06F 11/30; G06F 12/00; G01R 35/00
(52) U.S. Cl. .............. 702/186; 327/112; 702/107; 711/105
(58) Field of Search ................ 702/107, 186; 365/250, 299, 230.06; 711/2; 714/10, 12, 18, 48; 700/83; 327/112

(56) References Cited

U.S. PATENT DOCUMENTS

| 5,666,078 A | 9/1997 | Lamphier et al. |
| 6,141,258 A | 10/2000 | Kawasumi |
| 6,252,795 B1 | 6/2001 | Hansen ................ 365/173 |
| 6,314,014 B1 | 11/2001 | Lowrey ................ 250/221 |
| 6,442,644 B1 | 8/2002 | Gustavson et al. |
| 6,461,922 B1 | 10/2002 | Colombo ............. 438/299 |
| 6,462,591 B2 | 10/2002 | Garrett ................ 327/122 |
| 2004/0083070 A1 * | 4/2004 | Salmon et al. ........ 702/107 |

* cited by examiner

*Primary Examiner*—Michael Nghiem
*Assistant Examiner*—John Le
(74) *Attorney, Agent, or Firm*—Pillsbury Winthrop LLP

(57) ABSTRACT

A method of addressing a memory device on a memory module includes determining whether a command has been issued to the memory module. An evaluation state is entered if the command has been issued. While in the evaluation state, it is determined whether an identification signal has been issued for the memory device to initiate action. Action is initiated if the identification signal indicates that the memory device is to respond to the command issued.

32 Claims, 4 Drawing Sheets

METHOD OF ADDRESSING INDIVIDUAL MEMORY DEVICES ON A MEMORY MODULE

BACKGROUND

1. Technical Field

Embodiments of the present invention are directed to a memory module, such as a dual-inline memory module (DIMM). More particularly, embodiments of the present invention are directed to addressing an individual memory device, such as a dynamic random access memory (DRAM) device, on a memory module having a single precision resistor for calibration of the individual memory device.

2. Discussion of the Related Art

A Double-Data-Rate-II (DDR-II) synchronous dynamic random access memory (SDRAM) device is a high-speed complimentary metal oxide semiconductor (CMOS) random access memory (RAM) component. The DDR-II DRAM key features include: (1) posted column address strobe (CAS) with additive latency; (2) write latency=read latency −1; (3) normal and weak strength data-output driver; (4) variable data-output impedance adjustment; and (5) an on-die termination (ODT) function. All of the control and address inputs are synchronized with a pair of externally supplied differential clocks. Inputs are latched at a cross point of the differential clocks. All inputs and outputs are synchronized with a single-ended data strobe signal or a differential data strobe signal pair in a source synchronous fashion.

The DDR-II synchronous DRAM (SDRAM) device supports driver calibration via off-chip driver (OCD) impedance adjustment. OCD impedance adjustment is performed using an extended mode register set (EMRS) mode. The extended mode register controls functions beyond those of the mode register set (which specifies the read latency and the working mode of the burst counter). These additional functions include, for example, temperature compensated self-refresh and partial self-refresh. The OCD protocol enables a memory controller to adjust the strength of the DRAM driver. The memory controller makes adjustments that cancel out variations seen during computer system operation due to changes in voltage and temperature. By making such adjustments, operation at higher frequencies are achieved because the driver variation range is reduced. Table I below illustrates a sample Off-Chip Driver instruction set utilizing address lines A9, A8, and A7 (bits 9, 8, and 7, respectively).

TABLE I

| A9 | A8 | A7 | Operation |
|----|----|----|-----------|
| 0 | 0 | 0 | OCD calibration mode exit |
| 0 | 0 | 1 | Drive(1) DQ (data signal), DQS (data signal strobe), RDQS (read data signal strobe) high and differential DQS low |
| 0 | 1 | 0 | Drive(0) DQ, DQS, RDQS low and differential DQS high |
| 1 | 0 | 0 | Adjust mode |
| 1 | 1 | 1 | OCD calibration default |

To adjust the output driver impedance, a controller issues the "Adjust" EMRS command along with a 4 bit burst code to the DDR-II SDRAM device as in Table I above. For this operation, burst length (BL) is set at 4 via a mode register set (MRS) command before activating the OCD protocol, and the controllers drive the burst code to all data signals at the same time. The driver output impedance is adjusted for all DDR-II SDRAM device data signals (DQs) simultaneously and after OCD calibration, all data signals (DQs) of a given DDR-II SDRAM device are adjusted to the same driver strength setting.

Present methods of calibrating a driver output impedance or other active circuit when enabled ($R_{on}$) yields large variations in the actual $R_{on}$ values realized. Moreover, present methods of calibration of $R_{on}$ require a precision resistor dedicated exclusively to each memory device (e.g., each SDRAM device) on the memory module (e.g., a DIMM), which makes the overall memory system costly.

Accordingly, what is needed is a method for addressing individual memory devices/components and for calibrating the output impedance of a memory device driver or other active circuit when enabled ($R_{on}$), that is more efficient, more cost effective, and does not require adding any additional signals or changing any protocols.

DETAILED DESCRIPTION

Figure 1:
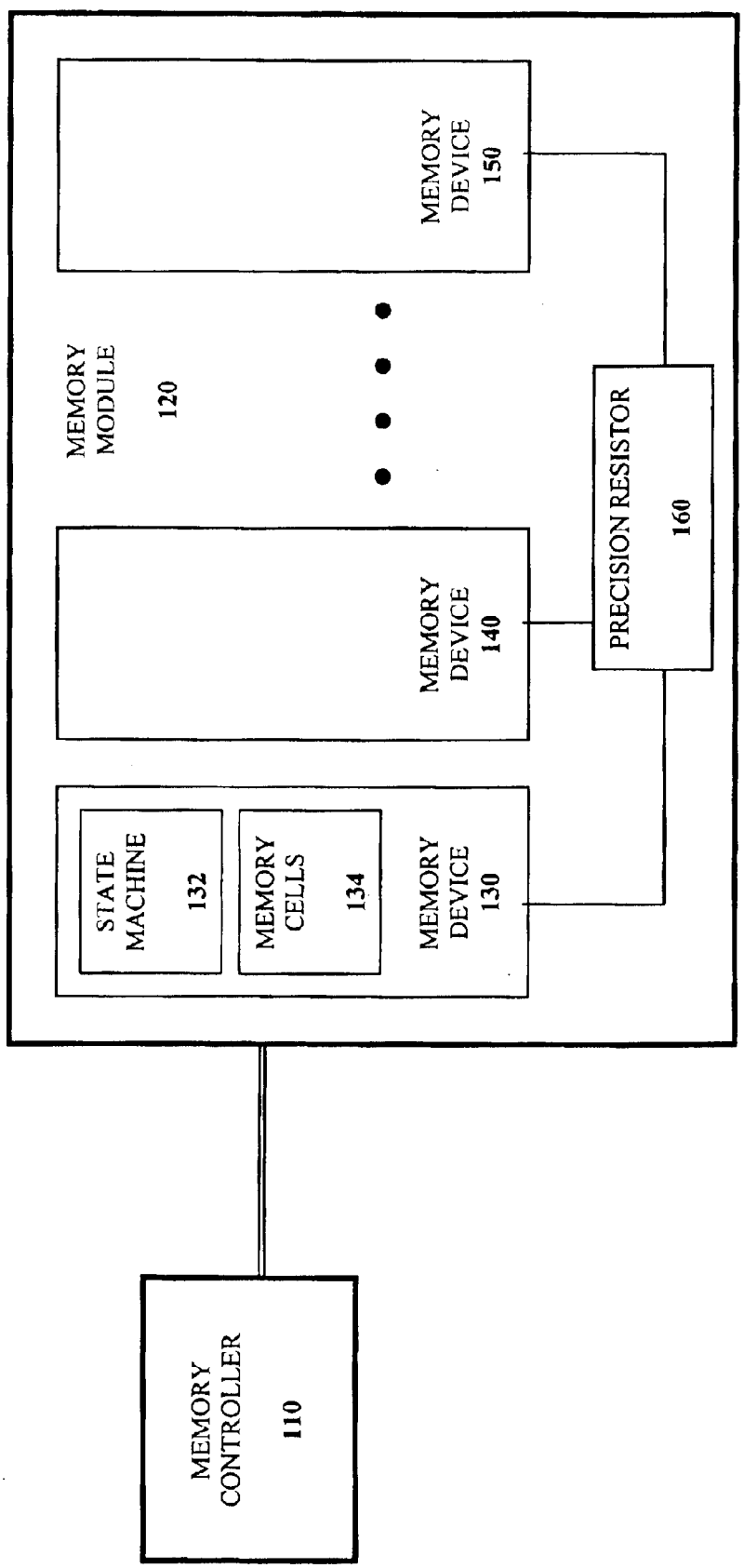
FIG. 1 illustrates a memory system according to an embodiment of the present invention.

FIG. 1 illustrates a memory system according to an embodiment of the present invention. A memory controller 110 is in communication with a memory module 120, such as a DIMM, having a plurality of memory devices 130, 140, 150, such as DRAM components/devices. According to an embodiment of the present invention, each memory device 130, 140, 150 utilizes toggling of appropriate data signals (DQ) in conjunction with an issued EMRS command (e.g., a calibrate command) to identify individual memory devices 130, 140, 150 that have been granted slots in which they may have exclusive access to a precision resistor 160 on the memory module 120 for calibration purposes. Each memory device 130, 140, 150 includes memory cells 134 to store data, and a state machine 132 having logic to monitor the toggling of the appropriate data signals (DQ) in conjunction with the issued EMRS command to determine when a particular memory device 130, 140, 150 has been granted a slot to exclusively access the shared precision resistor 160.

Figure 2A:
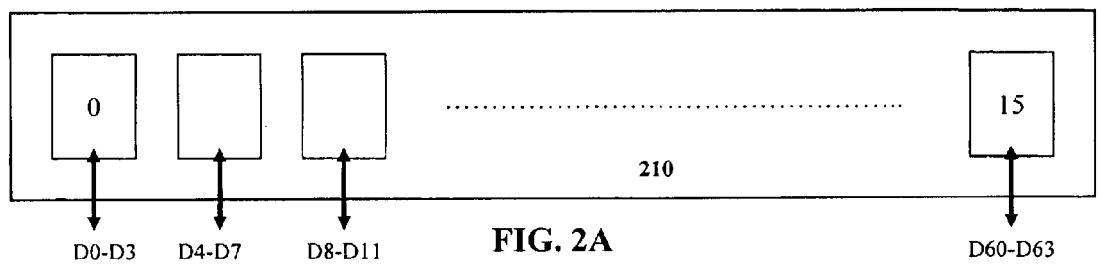
FIG. 2A illustrates an x4 based memory module.
Figure 2B:
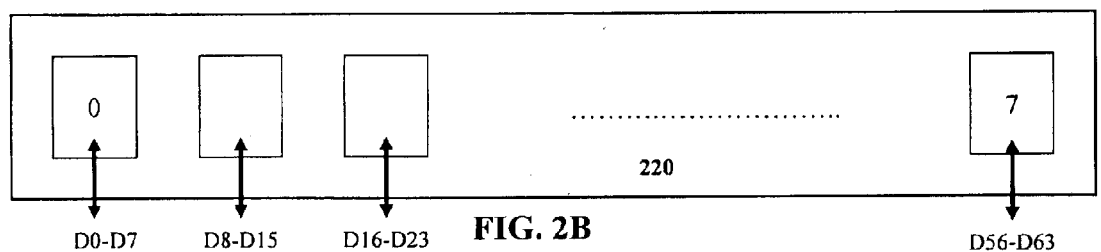
FIG. 2B illustrates an x8 based memory module.
Figure 2C:
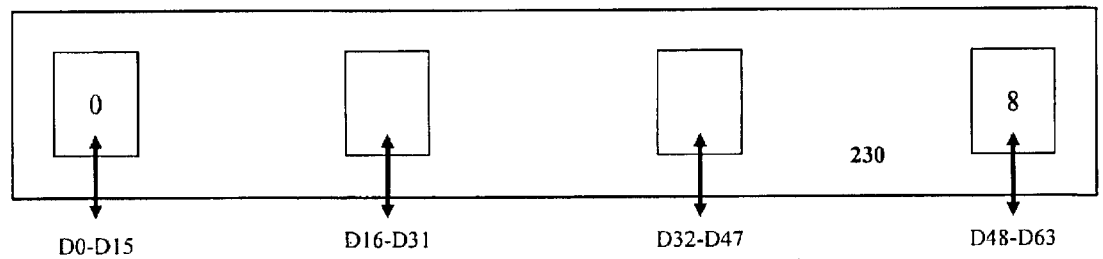
FIG. 2C illustrates an x16 based memory module.

According to one embodiment of the present invention, the least significant data bit (LSB) of a set of bits, the number of bits corresponding to the number of memory devices, is toggled to identify the appropriate memory device 130, 140, 150 on the memory module 120 that is being granted exclusive access to the precision resistor 160 to conduct calibration. Referring to FIG. 2A, if the memory module 210 is made up of x4 memory devices/components, the OCD protocol calls for the toggling of DQ0 for the first component (among the set of DQ0 to DQ3), DQ4 for the second component (among the set of DQ4 to DQ7), DQ8 for the third component (among the set of DQ8 to DQ11), and so on. Referring to FIG. 2B, if the memory module 220 is made up of x8 memory devices/components, the OCD protocol calls for the toggling of DQ0 for the first component (among the set of DQ0 to D7), DQ8 for the second component (among the set of DQ8 to DQ15), DQ16 for the third component (among the set of DQ16 to DQ23), and so on. Referring to FIG. 2C, if the memory module 230 is made up of x16 components, the OCD protocol calls for the toggling of DQ0 for the first component (among the set of DQ0 to DQ15), DQ16 for the second component (among the set of DQ16 to DQ31), DQ32 for the third component (among the set of DQ32 to DQ47), and so on. In short, each memory device/component on the memory module 210, 220, 230 has a unique least significant data bit (LSB) that may be utilized to identify that one particular memory device/component. However, any suitable identification method or scheme may be utilized.

Figure 4:
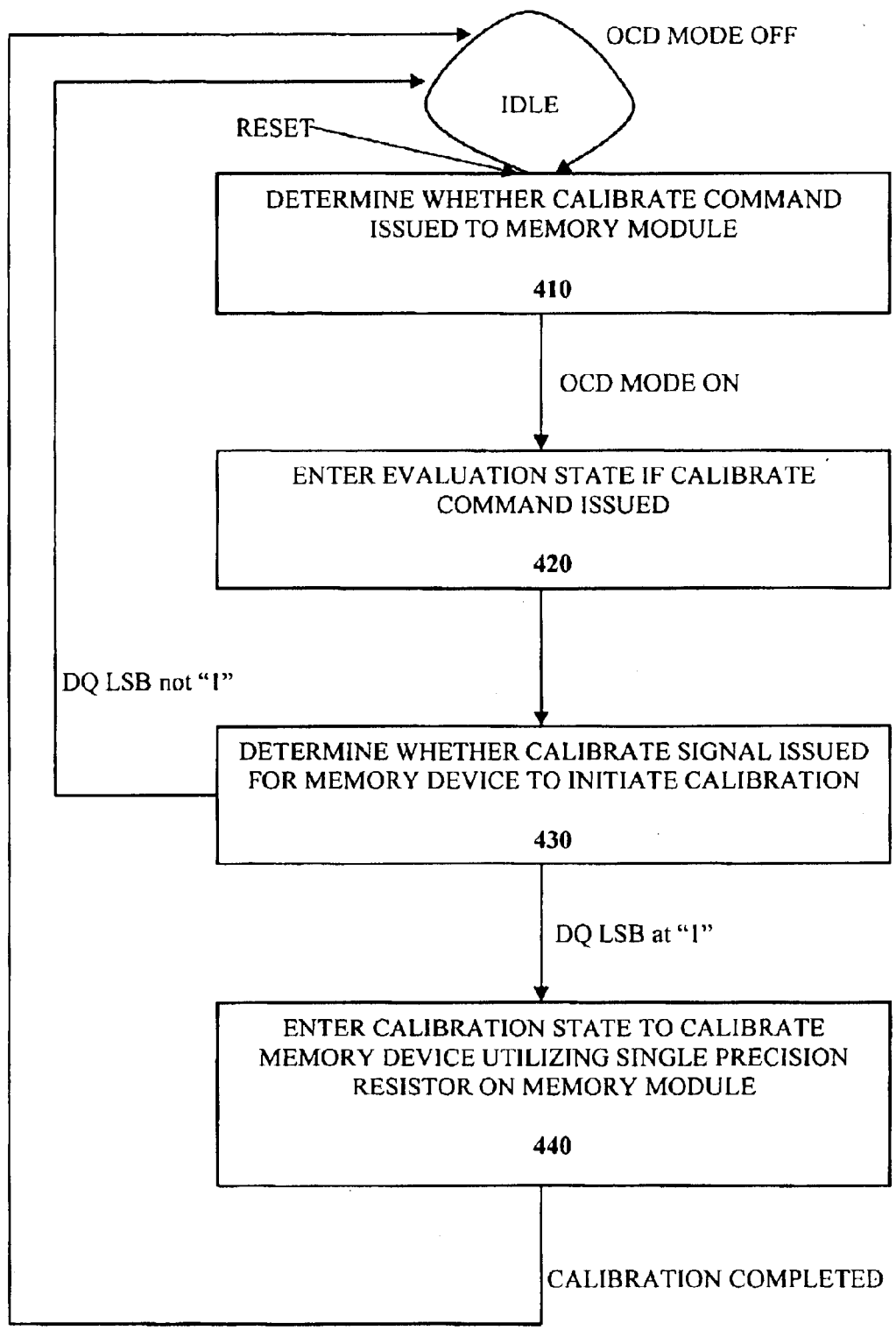
FIG. 4 illustrates a state machine flow chart diagram according to an embodiment of the present invention.

FIG. 4 illustrates a state machine flow chart diagram according to an embodiment of the present invention. One benefit accrued by the ability to address individual memory devices/components is efficient and cost-effective $R_{on}$ calibration—calibrating the output impedance of a memory device driver or other active circuit when enabled. According to an embodiment of the present invention as illustrated in FIG. 1, each individual memory device 130, 140, 150 includes a state machine 132 having logic to monitor toggling of the appropriate least significant data bit (LSB) along with the issued OCD EMRS command to determine when it has been granted a slot to exclusively access the shared precision resistor 160.

Figure 3:
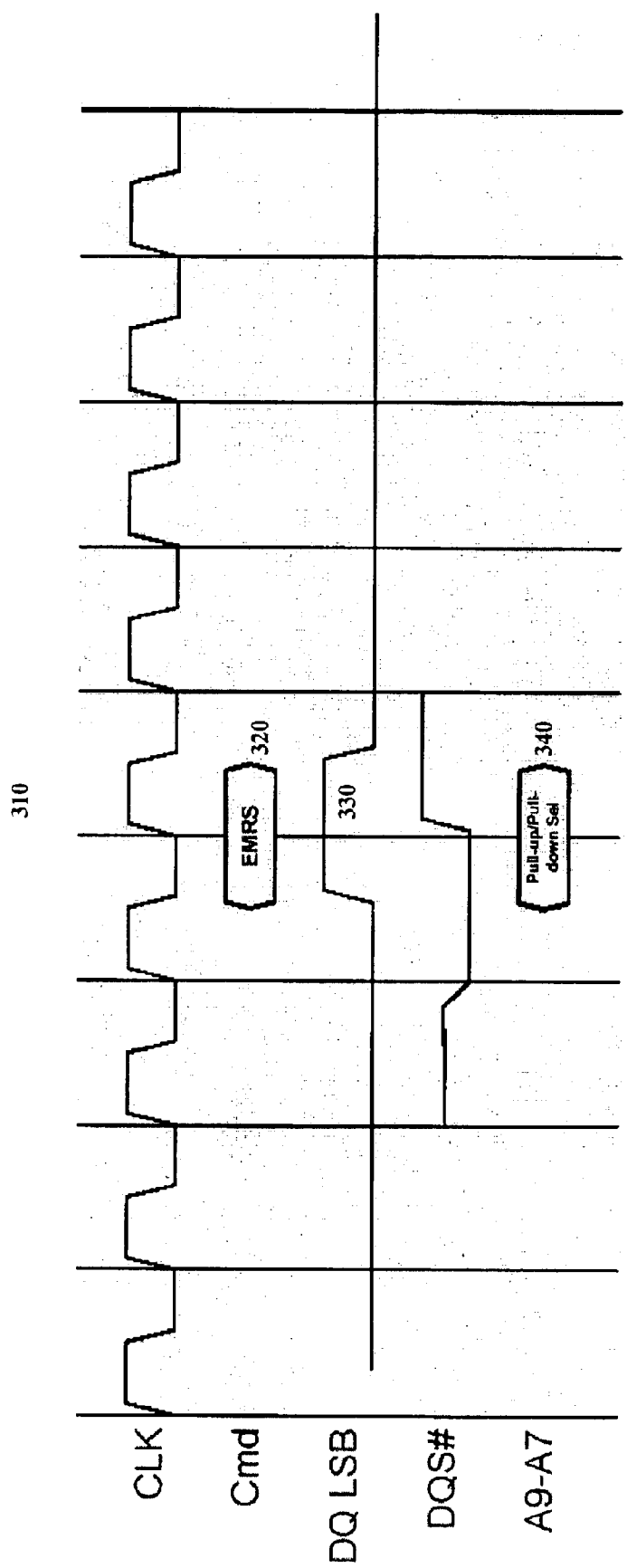
FIG. 3 illustrates a timing waveform diagram according to an embodiment of the present invention.

Referring to FIG. 4, when the memory device is initially reset, it is in an idle state. The memory device monitors and determines whether an OCD calibrate command has been issued 410 to the memory module having the memory device (among a plurality of memory devices). According to an embodiment of the present invention, the OCD calibrate command is an EMRS command 320 (see the timing waveform diagram 310 of FIG. 3) with the appropriate address bit sets as in Table I above. If the OCD calibrate command has been issued 410, then the memory device enters 420 an evaluation state.

In the evaluation state, the memory device determines 430 whether its corresponding least significant data bit (LSB) 330 (see timing waveform diagram 310 of FIG. 3) was toggled. If the LSB was not toggled, then the memory device goes back to the idle state. If the LSB was toggled, the memory controller is granting that particular memory device exclusive access to the precision resistor to conduct calibration.

The memory device enters 440 a calibration state (or a resistor compensation state, $R_{comp}$) to conduct calibration if the LSB was toggled. During calibration, it is desired to adjust the output driver on the memory device to have a specific output resistance of R. A precision resistor is provided external to the memory device (and preferably on the memory module) that is equal to R (or a multiple or R). Circuitry inside the memory device continuously makes adjustments to the output buffer to keep its resistance near R, as temperature and voltage vary during operation of the computer system utilizing the memory device. Once calibration is completed, the memory device goes back to the idle state. The output driver of the memory device is calibrated for optimal performance utilizing a shared precision resistor on the memory module.

According to embodiments of the present invention, calibration of a memory device in conjunction with a precision resistor yields a much tighter $R_{on}$ tolerance, only a single shared precision resistor is required per memory module, and individual memory devices/components may be addressed via an EMRS command without adding any extra signals or changing any protocols.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes that come within the meaning and range of equivalency of the claims are therefore intended to be embraced therein.

What is claimed is:

1. A method of addressing a memory device on a memory module, comprising:

determining whether a command has been issued to the memory module;

entering an evaluation state if the command has been issued;

determining, while in the evaluation state, whether an identification signal has been issued for the memory device to initiate action; and entering a calibration state to calibrate the memory device utilizing a single precision resistor on the memory module if the command has been issued and the identification signal indicates that the memory device is to respond to the command issued, wherein other memory devices on the memory module are prohibited from accessing the single precision resistor while the memory device is accessing the single precision resistor.

2. The method according to claim 1, wherein the command is an off-chip driver (OCD) extended mode register set (EMRS) command.

3. The method according to claim 1, wherein the identification signal is a least significant data bit (LSB) of a set that identifies the memory device from other memory devices on the memory module.

4. A program code storage device, comprising:

a machine-readable storage medium; and machine-readable program code, stored on the machine-readable storage medium, the machine-readable program code having instructions to determine whether a command has been issued to a memory module;

enter an evaluation state if the command has been issued;

determine, while in the evaluation state, whether an identification signal has been issued for a memory device on the memory module to initiate action; and enter a calibration state to calibrate the memory device utilizing a single precision resistor on the memory module if the command has been issued and the identification signal indicates that the memory device is to respond to the command issued, wherein other memory devices on the memory module are prohibited from accessing the single precision resistor while the memory device is accessing the single precision resistor.

5. The program code storage device according to claim 4, wherein the command is an off-chip driver (OCD) extended mode register set (EMRS) command.

6. The program code storage device according to claim 4, wherein the identification signal is a least significant data bit (LSB) of a set that identifies the memory device from other memory devices on the memory module.

7. A method of calibrating a memory device on a memory module, comprising:

determining whether a calibrate command has been issued to the memory module;

entering an evaluation state if the calibrate command has been issued;

determining, while in the evaluation state, whether a calibrate signal has been issued for the memory device to initiate calibration; and entering a calibration state to calibrate the memory device utilizing a single precision resistor on the memory module if the calibrate signal has been issued, wherein other memory devices on the memory module are prohibited from accessing the single precision resistor while the memory device is accessing the single precision resistor.

8. The method according to claim 7, wherein the memory device is calibrated to adjust a pull-up or a pull-down of a memory device driver.

9. The method according to claim 7, wherein the single precision resistor calibrates an output impedance of a memory device driver.

10. The method according to claim 7, wherein the memory device is a dynamic random access memory (DRAM) device.

11. The method according to claim 7, wherein the calibrate command is an off-chip driver (OCD) extended mode register set (EMRS) command.

12. The method according to claim 7, wherein the calibrate signal is a least significant data bit (LSB) of a set that identifies the memory device from the other memory devices on the memory module.

13. A program code storage device, comprising:

a machine-readable storage medium; and machine-readable program code, stored on the machine-readable storage medium, the machine-readable program code having instructions to determine whether a calibrate command has been issued to a memory module;

enter an evaluation state if the calibrate command has been issued;

determine, while in the evaluation state, whether a calibrate signal has been issued for a memory device on the memory module to initiate calibration; and enter a calibration state to calibrate the memory device utilizing a single precision resistor on the memory module if the calibrate signal has been issued, wherein other memory devices on the memory module are prohibited from accessing the single precision resistor while the memory device is accessing the single precision resistor.

14. The program code storage device according to claim 13, wherein the memory device is calibrated to adjust a pull-up or a pull-down of a memory device driver.

15. The program code storage device according to claim 13, wherein the single precision resistor calibrates an output impedance of a memory device driver.

16. The program code storage device according to claim 13, wherein the memory device is a dynamic random access memory (DRAM) device.

17. The program code storage device according to claim 13, wherein the calibrate command is an off-chip driver (OCD) extended mode register set (EMRS) command.

18. The program code storage device according to claim 13, wherein the calibrate signal is a least significant data bit (LSB) of a set that identifies the memory device from the other memory devices on the memory module.

19. A memory device on a memory module having a single precision resistor, the memory device comprising:

a plurality of memory cells to store data; and a state machine having logic to determine whether a calibrate command has been issued to the memory module, to enter an evaluation state if the calibrate command has been issued, to determine, while in the evaluation state, whether a calibrate signal has been issued for the memory device to initiate calibration, and to enter a calibration state to calibrate the memory device utilizing the single precision resistor on the memory module if the calibrate signal has been issued, wherein other memory devices on the memory module are prohibited from accessing the single precision resistor while the memory device is accessing the single precision resistor.

20. The memory device according to claim 19, wherein the memory device is calibrated to adjust a pull-up or a pull-down of a memory device driver.

21. The memory device according to claim 19, wherein the single precision resistor calibrates an output impedance of a memory device driver.

22. The memory device according to claim 19, wherein the memory device is a dynamic random access memory (DRAM) device.

23. The memory device according to claim 19, wherein the calibrate command is an off-chip driver (OCD) extended mode register set (EMRS) command.

24. The memory device according to claim 19, wherein the calibrate signal is a least significant data bit (LSB) of a set that identifies the memory device from the other memory devices on the memory module.

25. The memory device according to claim 19, wherein the calibrate command is issued by a memory controller in communication with the memory module.

26. A memory module, comprising:

a single precision resistor on the memory module; and a plurality of memory devices on the memory module in communication with the single precision resistor, wherein each one of the plurality of memory devices include a plurality of memory cells to store data, and a state machine having logic to determine whether a calibrate command has been issued to the memory module, to enter an evaluation state if the calibrate command has been issued, to determine, while in the evaluation state, whether a calibrate signal has been issued for a particular memory device to initiate calibration, and to enter a calibration state to calibrate the particular memory device utilizing the single precision resistor on the memory module if the calibrate signal has been issued, wherein other memory devices than the particular memory device on the memory module are prohibited from accessing the single precision resistor while the particular memory device is accessing the single precision resistor.

27. The memory module according to claim 26, wherein the memory device is calibrated to adjust a pull-up or a pull-down of a memory device driver.

28. The memory module according to claim 26, wherein the single precision resistor calibrates an output impedance of a memory device driver.

29. The memory module according to claim 26, wherein the plurality of memory devices are dynamic random access memory (DRAM) devices.

30. The memory module according to claim 26, wherein the calibrate command is an off-chip driver (OCD) extended mode register set (EMRS) command.

31. The memory module according to claim 26, wherein the calibrate signal is a least significant data bit (LSB) of a set that identifies the particular memory device from the other memory devices on the memory module.

32. The memory module according to claim 26, wherein the calibrate command is issued by a memory controller in communication with the memory module.

* * * * *